United States Patent
Russell

(10) Patent No.: US 7,256,596 B1
(45) Date of Patent: Aug. 14, 2007

(54) METHOD AND APPARATUS FOR ADAPTING A STANDARD FLYING PROBER SYSTEM FOR RELIABLE TESTING OF PRINTED CIRCUIT ASSEMBLIES

(76) Inventor: Robert J. Russell, 297 K St., South Boston, MA (US) 02127

( * ) Notice: Subject to any disclaimer, the term of this patent is extended or adjusted under 35 U.S.C. 154(b) by 0 days.

(21) Appl. No.: 11/553,428

(22) Filed: Oct. 26, 2006

Related U.S. Application Data

(60) Provisional application No. 60/732,404, filed on Nov. 1, 2005.

(51) Int. Cl.
*G01R 31/02* (2006.01)

(52) U.S. Cl. ...................................... 324/758; 382/145

(58) Field of Classification Search ................ 324/756, 324/758; 382/145; 356/237.4
See application file for complete search history.

(56) References Cited

U.S. PATENT DOCUMENTS

| | | | | |
|---|---|---|---|---|
| 6,084,663 A * | 7/2000 | Seng | ........................ | 356/237.4 |
| 6,307,389 B1 * | 10/2001 | Buks et al. | .................. | 324/758 |
| 6,677,773 B2 * | 1/2004 | Prokopp | ...................... | 324/761 |

* cited by examiner

*Primary Examiner*—Ha Tran Nguyen
*Assistant Examiner*—Christopher J Von Benken
(74) *Attorney, Agent, or Firm*—Faith F. Driscoll

(57) ABSTRACT

A method and apparatus allows adapting a standard flying prober system to manually or automatically determine the likelihood of error free probability of test point targets on Printed Circuit Assemblies (PCA's) which may have significant planarity irregularities. The method and apparatus provides a corrective function allowing error free probing of test target points on PCA's having planarity irregularities which otherwise make them impractical to test. The method and apparatus involves utilizing the camera system typically provided with a flying prober system and an auxiliary sighting system each having different optical axis angles, the use of which allows determination of height values.

20 Claims, 9 Drawing Sheets

METHOD AND APPARATUS FOR ADAPTING A STANDARD FLYING PROBER SYSTEM FOR RELIABLE TESTING OF PRINTED CIRCUIT ASSEMBLIES

CROSS REFERENCE TO RELATED APPLICATIONS

This is a non-provisional patent application claiming priority of provisional patent application for patent No. 60/732,404 filed Nov. 1, 2005.

This application is also related to my patent application Ser. No. 10/953,161 filed on Sep. 29, 2004 entitled "Method and Apparatus for Enabling Reliable Testing of Printed Circuit Assemblies Using a Standard Flying Prober System" which issued U.S. Pat. No. 7,053,642 on May 30, 2006.

BACKGROUND OF THE INVENTION

1. Field of Use

The present invention relates to flying prober systems and more particularly to systems for enabling reliable testing of printed circuit assemblies (PCA's).

2. Prior Art

Modern Flying Probers are a class of In-Circuit Test (ICT) equipment which use a plurality of moving probes in lieu of a standard bed of nails fixture to provide all or most connections between the PCA undergoing test and the test unit. Generally, flying prober tests are a subset of the tests that might have been performed by an ICT unit, because of the limited number of simultaneous connections possible between the PCA and tester. However, in present day test operations, such contact requirements have diminished compared with the recent past.

The principal benefit of flying probers is cost avoidance, in eliminating standard ICT bed of nails fixtures sometimes costing tens of thousands of dollars and having a short useful lifespan and little residual value. Another benefit is avoiding the delay associated with constructing such a fixture. Most flying prober models have four moving probes, mechanically positionable to any board location by a relatively high speed mechanism. The list of board locations to be used in testing a given PCA type is generally derived from computer aided design (CAD) files provided as part of nearly all modern PCA designs. The same files are similarly used to define nail location points in a bed of nails fixture in non-flying prober testing. Alignment of the PCA on the flying prober is accomplished using electro-optical methods, whereby registration holes of the PCA that would be engaged when mounted on a bed of nails are, instead, found by image recognition methods and their precise locations recorded. Then, instead of mechanically aligning the PCA to the tester, the list of probing locations is recalculated to take into account the actual positions of the registration holes, essentially aligning the tester to the PCA.

The electro-optical system usually is or is the equivalent of a miniature television camera connected through a digitizer to the computer used to control the tester in its execution of a test program. In addition to its usefulness in PCA to tester alignment, the electro-optical system is used for other purposes related to testing. For example, the probing points may be sighted one by one for the benefit of the test programmer in verifying that the CAD data, upon which the test program is based, indeed matches the PCA for which a test program is being developed. Usually, the television camera used for this purpose is mounted on the carrier that also holds one of the probes. It is mounted in a position that is a predetermined offset from the probe itself. Thus, while the television camera system may not be able to display the probe as it touches the PCA, it can be placed directly over the point where the probe would touch the PCA had not the offset been applied. The camera's optics are aligned perpendicularly to the ideal plane of the PCA, and allow cross hairs or similar positional markings to be added to the image, creating a bombsight effect and allowing confirmation of theoretical probe positioning to a very high degree of precision. For purposes of this explanation the term "ideal plane" is used to describe the plane of the flat surface of the etched printed circuit board upon which the various components of the PCA are mounted, assuming board fabrication exactly as designed, with no imperfections and somehow held in place for flying prober testing without affecting its perfect planarity. The display attached to the camera may also be used to verify the lack of probing obstacles in the vicinity of probing targets or that targets are otherwise suitable for probing. One or more additional cameras are sometimes employed to further aide in test programming and/or execution, showing, for example a larger area of the PCA, and at an angle that provides an overview of some probes as they are extended to contact test target points. The electro-optical system employed is sometimes sufficiently complex to allow Automated Optical Inspection (AOI) testing to be performed in conjunction with electrical flying prober tests.

While the nails of a standard ICT bed of nails fixture are mounted perpendicularly to the plane of the PCA while in its test position, flying prober system probing is performed at angles somewhat off perpendicular (Z-axis). Angles of between five and sixteen degrees to the Z-axis ("height axis") have been noted in some modern flying prober specifications. In some systems, the probe angle may be altered by test program commands. The angles are necessary to allow probing a series of closely spaced points by probes which are, by necessity, attached to relatively large drive mechanisms which allow speedy extension and withdrawal. Those mechanisms are in turn mounted to a carrier driven by an X-Y positioning mechanism. Two types of X-Y mechanisms used are linear motor and lead screw. Furthermore, the probes may be at angles to the X-axis or Y-axis as well as the Z-axis. A single X-Y table of probe points suffices, regardless of the number of probes, variety of angles, or designed thickness of the particular PCA type being tested, by applying appropriate offsets as compensation for these effects in determining the precise point at which the PCA will be contacted.

However, the compensation discussed above is based upon the assumption that the probing points of the PCA exist in an ideal plane, or at predetermined distances from an ideal plane. Warpage of the PCA is both non-planar and unpredictable. Hence, planarity variations result in probing variations. In some cases, the intended test probing target may be probed slightly askew from the intended point of contact, usually the center of a circular target. In other cases, the probe may miss the target altogether. For example, consider the case of a probe which is fifteen degrees from perpendicular attempting to probe a target point which is 35 mils in diameter. The required probing accuracy would be +/−17 mils, assuming the probe will not slide once one physical contact is made (not a safe assumption). At an angle of fifteen degrees, a 17 mil error occurs when the height of the intended target is approximately $\frac{1}{16}$" (0.017"/0.268, the tangent of 15 degrees). The actual safe region for contacting a 35 mil target with a 15 degree probe is a matter of opinion. If, however, half the error were considered safe (about 8 mils), the height would have to be predictable to within approximately 1/32". Maintaining a planarity tolerance of +/−1/16" is generally not possible in a manufacturing environment with PCA's measuring 16" by 16" or more. Even with larger test target points, the planarity requirements are often impractical to maintain. However, some test target points of modern PCA's may be less than 20 mils.

In the art of PCA testing using flying probers, planarity variations that cause a misprobe are a known problem, but there is a paucity of detailed data as to its significance. One result of a misprobe is a false error (e.g., when testing for resistance and getting an open indication) or a missed error (e.g., when a short is present but not detected). But, there are so many possible reasons for such errors, such a large quantity of such errors and so little engineering time to devote to making exact determination of error causes (real vs. false), that the effectiveness of available attempted solutions to the planarity problem has never been fully tested. Such attempted solutions are, e.g., standoff posts used to support a concave PCA from the underside during probing (but which may have no effect on convex PCA's) and standoff posts which attempt to apply either an upward or downward force, as needed, by means of vacuum applied over so small an area as to effect only relatively flexible PCA's. In all such cases, the required planarity cannot be guaranteed in a production environment.

In addition to the problems incurred in attempting to force a PCA to become sufficiently flat for flying prober testing is the issue of whether it is advisable to do so at all. Connections of devices soldered to the surface of a PCA (e.g., surface mount or ball grid array-BGA-devices) may be mechanically stressed by forcing the PCA to become flatter than it is when not being tested. Furthermore, it sometimes may occur that the means of applying pressure is applied at the wrong point (e.g., through operator error) or to points which are not at the intended level in relation to the PCA surface (e.g., through PCA assembly errors). Stresses to PCA connections may result in cracking and cause intermittent contacts which later cause errors in system operation of the PCA. Such errors are difficult or impossible to diagnose on a practical basis.

Misprobes may also occur when the probing target is large enough that it will not be missed despite skewed probing caused by height differences. In such cases, the force applied by the probe may be inadequate, causing a lack of contact between the probe and PCA, or too great, causing marking of the contact area. The marking may be in the form of a pit or a scored line, the latter resulting when the probe is pushed by excessive force. The marking occurs because probe contact depends upon spring force. In normal operation, contact force is achieved by attempting to drive the probe perhaps 50 to 100 mils further than would be required for the tip to make contact with the PCA probing point. At contact, the probe will stop moving and its internal spring will compress to take up the distance, providing contact pressure. Should the PCA contact point be significantly closer to the probing mechanism, early contact would be made and the probe might be driven 100 mils before the 100 mils previously referenced, for a total of 200 mils. In some cases, the spring might even fully compress, causing the probe to be driven against the PCA with the maximum force the probe extension motor can produce. In certain applications, significant marking of PCA targets is not tolerated and the PCA has to be reworked or scrapped.

In addition to PCA warpage issues, another problem confronting flying prober users is that of devices erroneously mounted on the PCA during the assembly process. Similarly, a test program for a PCA where optional components should not be mounted may be mistakenly applied to a similar PCA where these components are mounted. The occurrence of either situation may result in damage to the PCA and or the flying prober system. In some cases, the flying prober damage or misalignment may interrupt the production process for a long period of time and at great expense.

The cross-referenced patent is of primary benefit in dealing with PCA's exhibiting warpage when integrated with the software which controls the flying prober. That is, it enables sensing of and compensation for warpage conditions. However, there exist certain applications where there is no opportunity to modify the software controlling the flying prober.

Accordingly, it is a primary objective of the present invention to provide a method and apparatus for overcoming variations in PCA planarity of PCA's mounted for testing in a flying prober system.

It is a further objective of the present invention to utilize extensively hardware typically found on existing flying prober systems, making practical the retrofitting of such systems to incorporate the present invention.

It is an even further objective of the present invention to provide an improved method and apparatus for overcoming variations in PCA planarity of PCA's mounted for testing in a flying prober system when alteration of or integration with the software which controls the flying prober system is not practical.

It is a still even further objective of the present invention to provide a method and apparatus suitable for efficiently detecting components erroneously mounted on a PCA before damage can occur.

SUMMARY OF THE INVENTION

The above and other objects of the present invention are achieved in a preferred embodiment of a method and apparatus which can be added as an independent unit into an existing standard flying prober system or included in the design of a new flying prober system. Generally, the flying prober system includes at least one probe for testing PCA's and a bombsight camera system with an optical axis set perpendicularly to the ideal plane of the PCA to be tested. In the preferred embodiment, an auxiliary sighting system is added to the flying prober system, generally, but not necessarily near and at an angle to the bombsight camera. More specifically, in the preferred embodiment, the auxiliary sighting system is set at an angle to the ideal plane of the PCA and mounted to the same support as the bombsight camera system. The auxiliary sighting system may utilize an imaging device, such as a television camera, or precision source of light, such as an optical lens and lamp device or one of various types of lasers, optionally having features such as focusability and/or the ability to produce line or cross line patterns.

The method of the present invention includes manual or automatic additional processing and analysis of the data obtained from either or both of the auxiliary sighting system camera, where a television camera is utilized as part of the auxiliary sighting system, or the bombsight camera which includes an electro-optical system, or television camera for providing a bombsight display to check the match of CAD data to the PCA being programmed and for other programming and test purposes. As an independent feature, the method and apparatus of the present invention allows manually checking the effect warpage of a given PCA might have on probing accuracy and, in some cases, manually taking steps to compensate for that warpage. As a fully integrated feature, the invention allows for automatically extending the X-Y probe list to include height data (i.e., an X-Y-Z list). Once this height data has been added to the probe list, the appropriate offsets may be calculated and applied during test program execution on a probe by probe basis in the same manner as the application of angular offsets previously described as being part of a standard flying prober system.

The preferred embodiment may also include illuminator apparatus which may be considered optional in some cases, advantageous primarily where it is desired to operate the television imaging camera(s) at decreased apertures or when part or parts of the present invention interferes with the illumination otherwise provided by the flying prober system to which the present invention is added.

The auxiliary sighting system apparatus of the present invention is calibrated to be in a known position in relation to the bombsight camera using a PCA or similar device having known Z-axis values at various points. Later, during testing with the PCA to be tested mounted in the flying prober, the bombsight camera is positioned over predetermined test target points according to data derived from the CAD file and by means of the carrier system. For purposes of clarity the phrase "test target point" is used herein to denote a point on the PCA at which the tester may be selected to make electrical contact during testing of the PCA.

For each predetermined test target point, the point on the surface of the PCA centered in the cross hairs of the bombsight camera is compared to the positional information of the auxiliary sighting system. For example, in the case where the auxiliary sighting system utilizes a television camera, the point centered in the cross hairs of the bombsight camera will appear in a position on a monitor attached to the camera of the auxiliary sighting system to be in correspondence to the relative positions of two points on the calibration PCA having the same respective Z-axis positions (heights). In the case where the auxiliary sighting system utilizes a spot laser with an angled optical axis matching the angle of one of the flying prober test probes and the calibration process includes adjusting the optical axis of the auxiliary sighting system laser device to coincide with the optical axis of the bombsight camera when a surface having a height corresponding to Z-axis zero is placed directly under the bombsight camera, the position of the spot projected by the laser device would indicate the point on the test target point that would be contacted by the particular test probe. Furthermore, if the angle of the auxiliary sighting system matches the angle of the flying prober probe(s) having the greatest angle from perpendicular, and the laser spot observed in the bombsight camera monitor was seen to be within the area of the test target point suitable for making proper contact between the probe and test target point, it could be inferred that any of the plurality of test probes of the flying prober system would also make proper contact with the same test target point (assuming circular shaped test target points).

As stated above, the apparatus of the present invention may be added to a flying prober system either as an independent enhancement or as a fully integrated feature. As an independent enhancement, there is no interaction between the apparatus of the present invention and the software or hardware of the flying prober system as it existed before adding the apparatus of the present invention. All measurements, observations and determinations would be made by the system operator according to the method of the present invention. As a fully integrated feature, the apparatus of the present invention may be designed into a new or existing flying prober system such that all measurements and determinations are made automatically. Furthermore, such a fully integrated system may include means of automatically compensating for PCA warpage.

It is worth noting that, in an application of the present invention which relies on operator intervention, a limited possibility of compensating for warpage exists. By operator manipulation of the PCA thickness parameter of some standard flying prober software, a subsequent recompilation of the X-Y listing may result in probing offsets which make an otherwise untestable PCA suitable for test.

Also, in certain implementations, the apparatus of the present invention may, be added to an existing flying prober without requiring precision or complex installation, thus making it possible to supply the apparatus of the present invention in kit form for installation by staff personnel normally employed in most flying prober operating environments or installations. For example, in the simplest case, installation would require the mounting of the auxiliary sighting system relative to the bombsight camera system utilizing standard mounting hardware such as brackets or strapping materials.

Furthermore, the apparatus and method of the present invention also may be used to detect for the presence of components mounted at PCA locations where collisions might occur with probes or other parts of the flying prober during execution of a test program. An auxiliary sighting system that uses a cross line laser, for example, might be passed over the entire surface of the PCA prior to or as part of the process of checking for PCA warpage. The "broken line" image produced by components that might interfere with subsequent testing could be readily recognized by an automated system or an astute operator.

The above objects and advantages of the present invention will be better understood from the following description when taken in conjunction with the accompanying drawings.

DESCRIPTION OF THE PREFERRED EMBODIMENT

Figure 1:
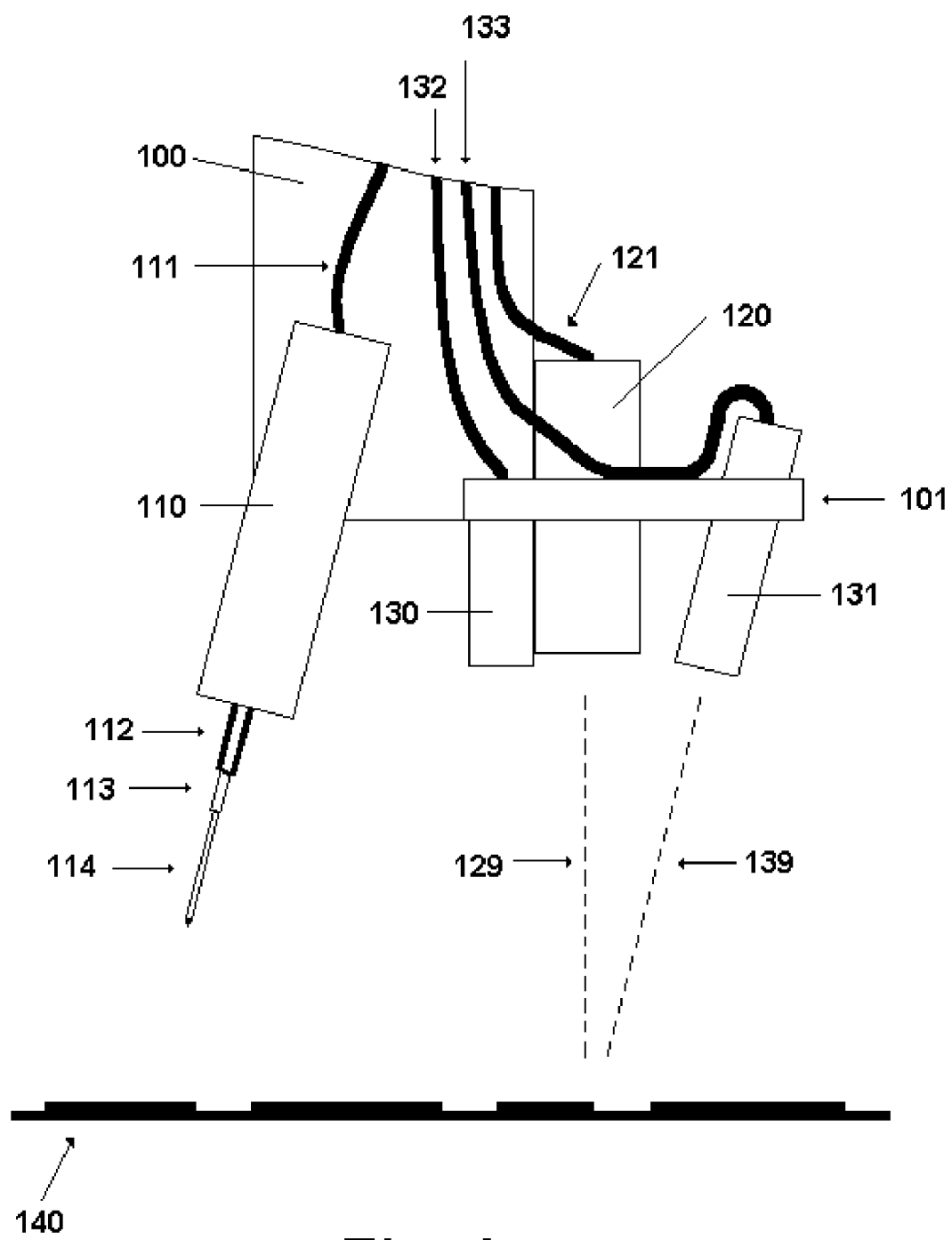
FIG. 1 shows details of a flying prober system probe carrier and the mounting of the probe mechanism and imaging systems thereon in relation to a PCA to be tested that includes the apparatus of the present invention.

With reference to FIGS. 1 through 9, the apparatus and method of the present invention will now be described relative to its application to a particular system. The system shown in FIG. 1 is part of a standard flying prober system that uses a television imaging camera (i.e., bombsight camera) 120 positioned to provide a clearance of about four inches above the PCA being tested, PCA 140. A probe carrier 100 is attached by means not shown to a conventional mechanism not shown used for moving carrier 100 about the flying prober in X-axis and Y-axis directions on a plane parallel to the ideal plane of PCA 140. Camera 120 and bracket 101 are attached to carrier 100. Broken line 129 indicates the optical axis of camera 120. Cable 121 connects camera 120 to the test system, both for power and imaging. Auxiliary sighting system 131 of the present invention and optional illuminator 130 are also attached to mounting bracket 101 in such a manner as not to interfere with subsequent probing operations. Broken line 139 indicates the optical axis of auxiliary sighting system 131. Illuminator 130 is selected and mounted to cover the field of view of camera 120. Cable 132 is used to provide power to illuminator 130. According to the present invention, auxiliary sighting system 131 is mounted at an angle to the perpendicular as discussed herein.

A probe 114 is shown in a retracted position, nominally more than two inches above PCA 140. This distance allows unrestricted X-axis and Y-axis movements of carrier 100 without striking most large components that might be mounted on PCA 140. Probe 114 and barrel 113 form an integral assembly within which a spring exists, causing a controlled force to be exerted between the tip of probe 114 and a point which it first contacts and then is further pushed against by moving barrel 113 closer to PCA 140, such movement being under test system control. A probe holder designed to accommodate the probe assembly including barrel 113 and probe 114 forms part of a linear motor arm 112. Arm 112 is extended from or retracted into a linear motor probing module 110 through its connection to a control system via cable 111. The extension of arm 112 may be selectively controlled in increments of 10 mils from zero to 2.1 inches on an axis of 15 degrees from perpendicular to the ideal plane of PCA 140. The 15 degree axis is chosen for explanatory purposes as the greatest angle from perpendicular at which any of the plurality of probing modules, such as module 110, are mounted to one of a plurality of carriers such as carrier 100 included as part of the flying prober system.

It should be noted that, in flying prober systems having a plurality of probing modules, a probing module having the greatest probing angle need not necessarily be attached to the same carrier as the carrier to which a television imaging system is attached. It should also be noted that probing modules may or may not be aligned to the Y-axis of carrier 100 movement as a matter of flying prober system design choice and the plurality of probing modules within a given flying prober system may each be mounted at various angles.

As shown in FIG. 1, auxiliary sighting system 131 is attached to bracket 101. The attachment means may be fixed, adjustable for precise alignment by a calibration process, or by means convenient for quick removal or reinstallation, such as a clamp. Cable 133 connects auxiliary sighting system 131 to power, control and, optionally, imaging apparatus not shown. Auxiliary sighting system 131 is mounted at an angle to the perpendicular, within a tolerance largely determined by the mounting means (e.g. bracket 101). It will become apparent in the further description of the present invention that the mounting angle of auxiliary sighting system 131 affects the resolution and accuracy of Z-axis measurements and the ease with which an operator or automatic system may interpret the presentation or data that auxiliary sighting system 131 provides or enhances.

In the preferred embodiment, auxiliary sighting system 131 may be implemented in various ways. It may utilize a television imaging camera, similar to camera 120, or it may utilize a light source, such as an optical lens and lamp combination for producing a pinpoint of light on the surface of PCA 140. It may also utilize different types of lasers, including fixed and variable focus spots and fixed and variable focus line and cross line units. Such laser units are readily available for purchase from numerous sources. When auxiliary sighting system 131 utilizes a light source, it may be advantageous for it to be switched on and off as a means of making it more distinguishable from random reflections.

FIGS. 2 through 9 will now be referenced to describe the various forms of auxiliary sighting system 131 and the benefits derived from various mounting arrangements using bracket 101 or its equivalent.

Figure 2:
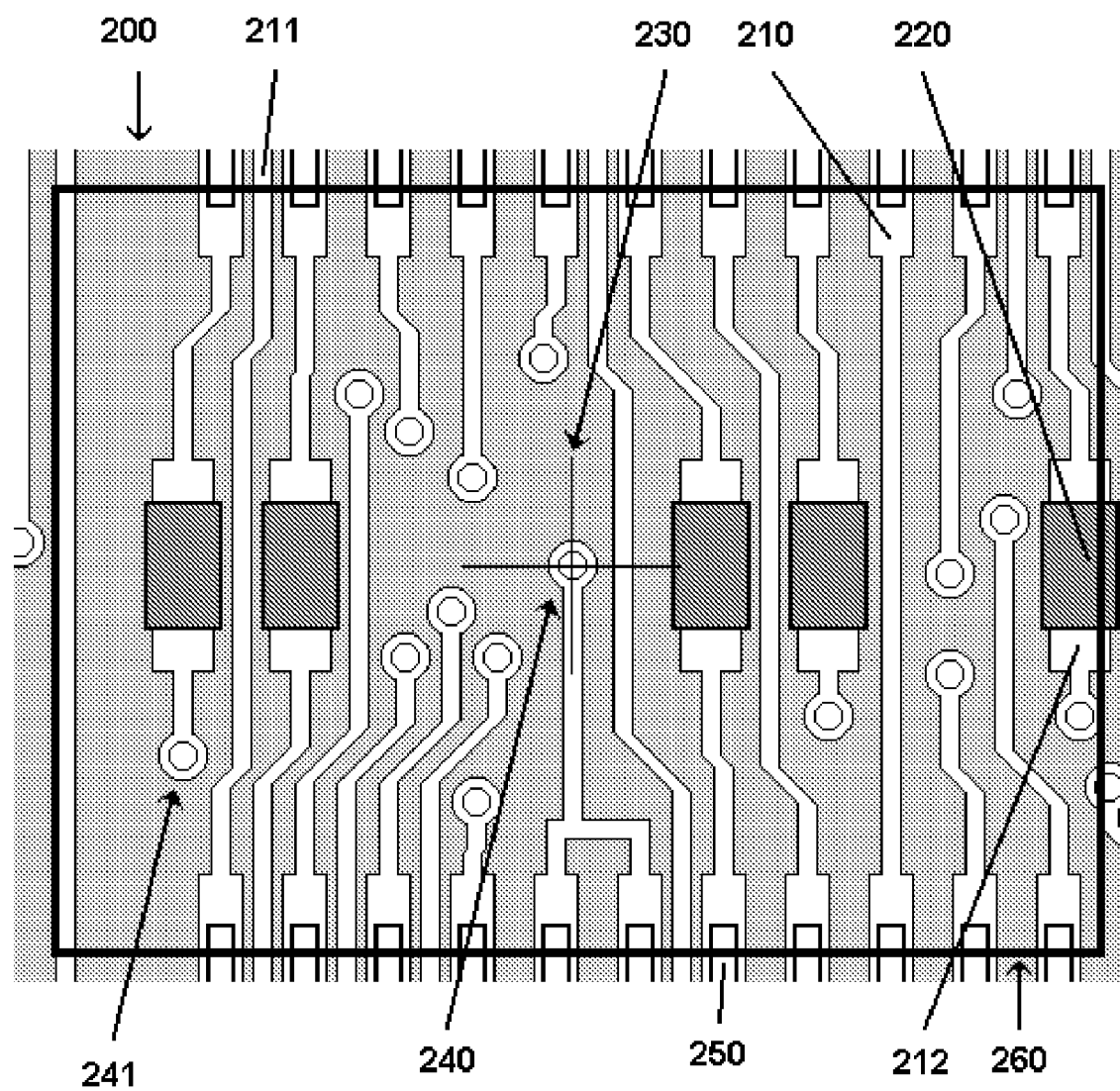
FIG. 2 shows an area of a sample PCA in detail, outlining the section which would be shown by a typical flying prober imaging system (i.e., of a bombsight camera).

FIG. 2 illustrates the image of camera 120 as it might appear on a monitor provided for operator use on a standard flying prober system. PCA section 200 of FIG. 2 corresponds to a part of PCA 140 of FIG. 1. Box 260 represents the image from camera 120 that would appear on the bombsight camera monitor. Cursor 230 is typically generated electronically within the camera 120 or monitor system or within a processing unit connected between the two. PCA details shown are: etch 211, etch pad at which a surface mount leaded device is soldered 210, lead of a surface mount leaded device 250, etch pad at which a discrete device such as a resistor is soldered 212, discrete device 220 and via 241, the latter being a point at which connection between etch layers of PCA 140 is provided by virtue of a hole, the sides of which have been plated.

By way of example, another via, 240, is indicated in FIG. 2 as having been selected as a test target point to be used in testing PCA 140 and carrier 100 has been used to position camera 120 to show that test target point. Assuming (1) the CAD data provided to the flying prober system is correct, (2) the center of via 240 is one of the points included in the CAD file and (3) that PCA 140 has been properly mounted and aligned within the flying prober system, the center of cursor 230 will appear as aligned with the center of via 240, when via 240 is selected for operator viewing using bombsight camera 120.

Figure 3:
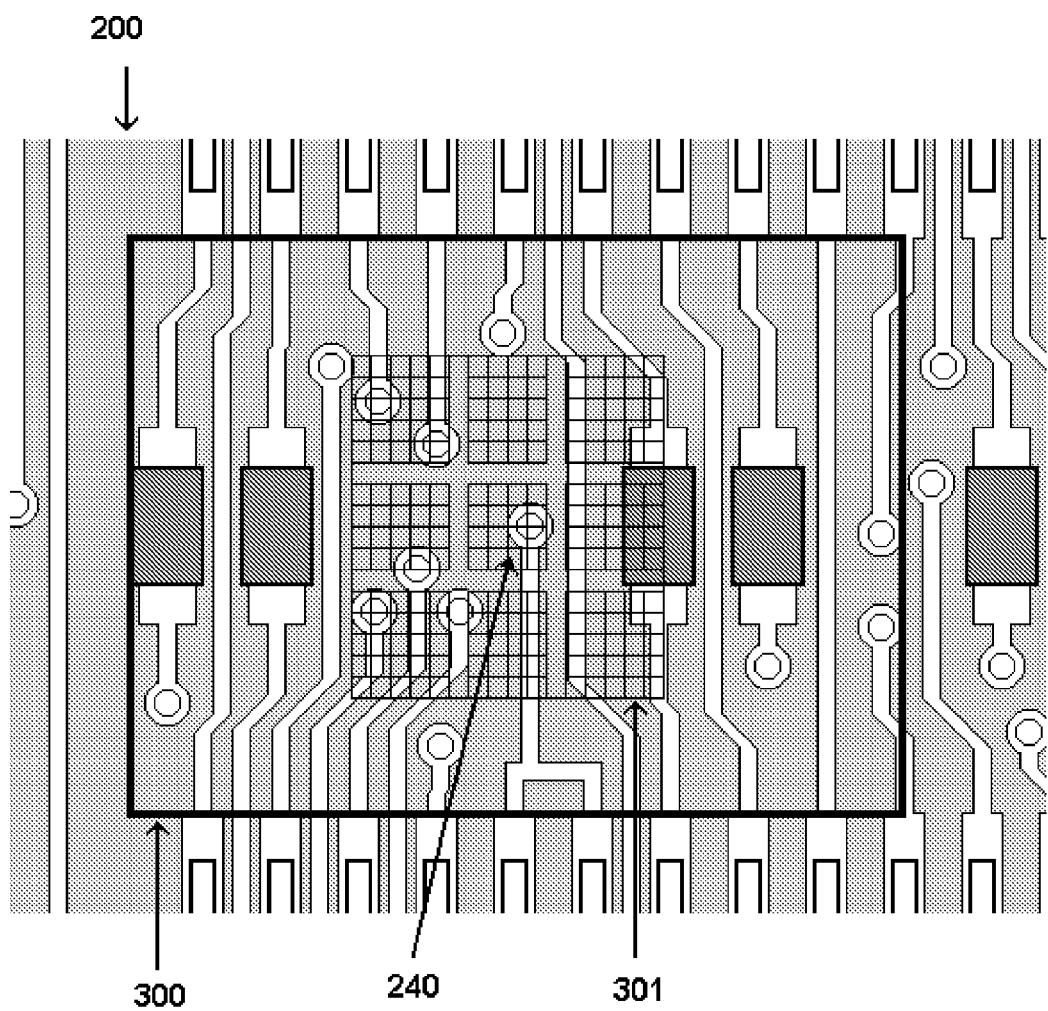
FIG. 3 shows the image provided by the auxiliary sighting system of the present invention with a PCA having ideal planarity when the auxiliary sighting system utilizes a television camera.

FIG. 3 illustrates the same section, 200, of PCA 140 as viewed through auxiliary sighting system 131, when system 131 is a television camera similar to camera 120. The image that would appear on yet another operator monitor (i.e., in addition to the bombsight monitor) is outlined by box 300. It should be noted that, while camera 131 is mounted at an angle which would cause distortion known as "keystoning"

of the image, the section of PCA 140 viewed as being within box 300 is shown as a rectangle for clarity of explanation. That is because the shape of the PCA 140 section viewed within box 300 cannot be determined without defining the angle and mounting position of camera 131 in relation to camera 120 and the operation and benefit of the present invention is not significantly affected in practice by differences in the section of PCA 140 viewed from one position to another position of camera 131. Grid 301 or a similar grid may be superimposed electronically on the monitor presentation, or be a physical overlay placed over the monitor screen. In either case, the grid may be fixed or movable on either axis or in rotation. For purposes of the present explanation, grid 301 will be assumed to be superimposed and fixed.

Figure 4:
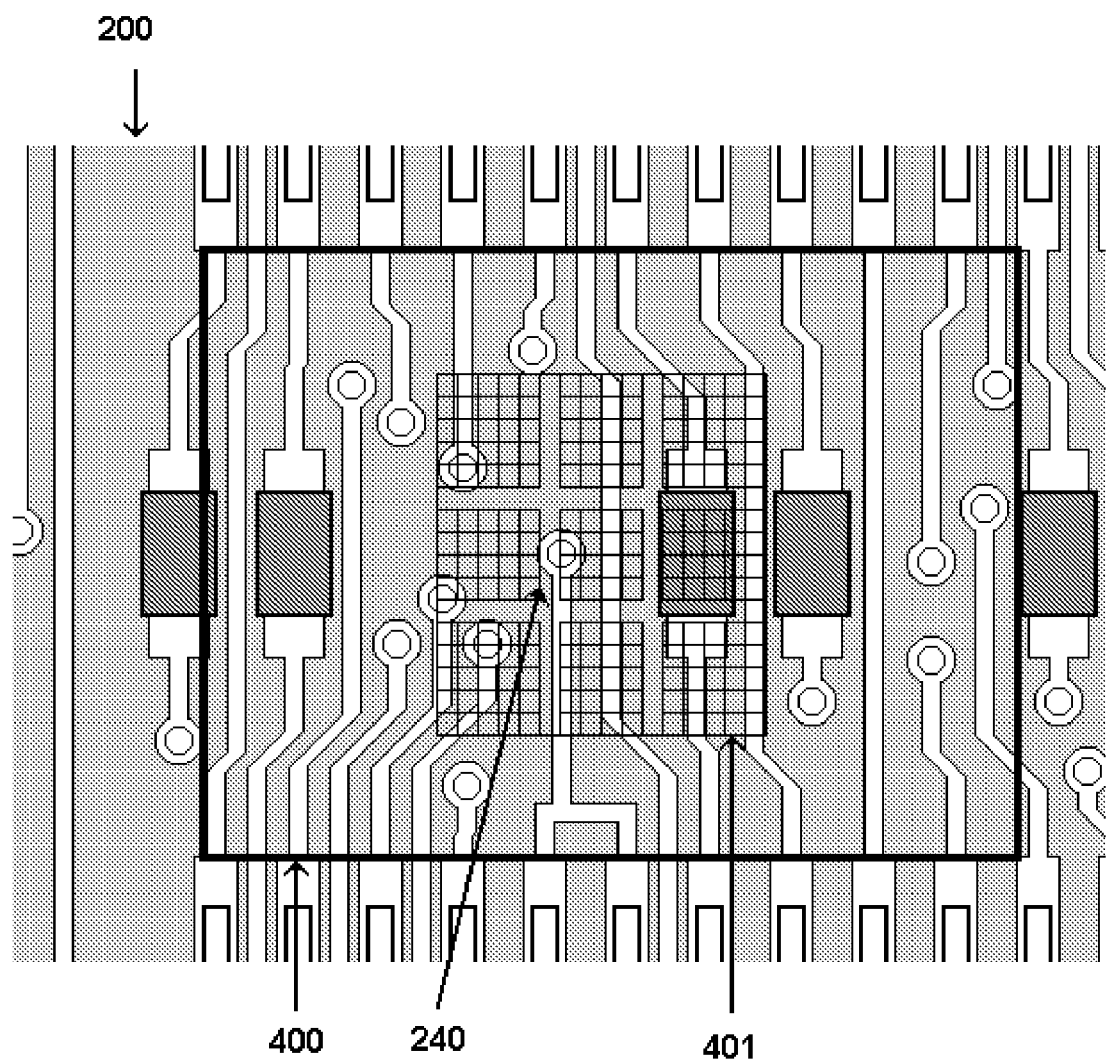
FIG. 4 shows the image provided by the auxiliary sighting system of the present invention with a PCA having imperfect planarity when the auxiliary sighting system utilizes a television camera.

FIG. 4 illustrates the same section, 200, of PCA 140 which has been repositioned at a different Z-axis position in the flying prober system. That is, the vertical distance from a point on carrier 100 is different than it was in FIG. 3. It is assumed that PCA 140 has been properly mounted and aligned within the flying prober system, in all respects other than the Z-axis variation purposely induced. Thus, the view of via 240 provided by camera 120 will be essentially the same as shown in FIG. 2. However, the difference in position of via 240 in FIGS. 3 and 4 should be noted. This is because the view of via 240 provided by auxiliary sighting system angled camera 131, represented by box 400, is now a slightly different section of PCA 140 than in FIG. 3, where the view was represented by box 300. Accordingly, grid 401 is thereby superimposed over a different section of PCA 140 than was grid 301 in FIG. 3.

It will be appreciated that the difference in apparent positions of via 240 between FIGS. 3 and 4 is proportional to the variation in Z-axis position of PCA 140 between the same two figures, that difference resulting from the angular positioning of auxiliary sighting system camera 131. That is, while the view from camera 120 remains centered on the same point on PCA 140 regardless of Z-axis position, the point at the center of view from auxiliary system camera 131 will vary in proportion to a Z-axis position difference of PCA 140. It will be further appreciated that any point on PCA 140 having the same Z-axis position in relation to camera 120 as another point on PCA 140 will appear in the same position on the grid superimposed on the image of auxiliary sighting system camera 131 as that other point when camera 120 is moved from a position directly over the first point to a position directly over the second point. Thus, for two points each viewed to be in the center of images from camera 120 one taken before and one taken after a repositioning of carrier 100, the difference in position of the same two points in respective views from camera 131 is proportional to the difference in Z-axis position of those two points. Hence, once the Z-axis position of any point on PCA 140 is known, the Z-axis position of any other point on PCA 140 may be determined by observing the difference in position of the two points as viewed in the respective images obtained from auxiliary sighting system camera 131 and comparing the difference to observations made with a PCA having known Z-axis positions at a plurality of points (e.g., a calibration PCA). Furthermore, when such a PCA as a calibration PCA includes a Z-axis zero point reference and the plurality of points includes points above and below that zero point to the extent which points on a PCA 140 could vary in Z-axis position due to manufacturing tolerances of PCA's such as PCA 140, the Z-axis position of all points on a particular PCA 140 may be determined with respect to that reference and not just in respect to other points on that particular PCA 140. Alternatively, in cases where auxiliary sighting system camera 131 is precisely mounted and its angle relative to the optical axis of the bombsight camera has been precisely determined, the Z-axis position of any point on a particular PCA 140 may be calculated using triangulation once the system has been calibrated to a Z-axis zero point. For example to utilize triangulation first position the bombsight camera over a point on the PCA, next note the x, y location of the point, then reposition the carrier such that the PCA point used in the first step is aligned with the calibration point on the monitor screen of the auxiliary sighting system camera (the point where a PCA point at the Z-axis zero position which is centered in the cross hairs of the bombsight camera simultaneously appears on the monitor screen of the auxiliary sighting system camera), then next note the x, y differences from the original carrier position and calculate the linear movement (square root of the sum of the square of the x difference plus the square of the y difference) and multiply the result by the cotangent of the calibrated angle of the auxiliary sighting system. By way of example, if the auxiliary sighting system were set at 15 degrees from the perpendicular angle of the bombsight camera and the movement of the carrier were 0.010 inches, then the Z-axis location of the point would be 0.037" above or below the Z-axis zero position.

Although the present invention has been described above in terms of manual viewing and comparing images for the purpose of locating points, it will be appreciated by those skilled in the art of flying probers that the image matching software used in automatic alignment of PCA's mounted in the test position of a flying prober system and in other PCA feature recognition software generally used in flying probers could be readily adapted to obviate the operator role in making measurements used in determining Z-axis positions in the manner of the present invention. Therefore, it would be possible to design a flying prober system utilizing the present invention whereby the Z-axis position of a plurality of points on a PCA mounted for testing could be determined automatically.

It will also be appreciated by those skilled in the art of flying probers that the function of the perpendicularly mounted bombsight camera and the function of an auxiliary sighting system utilizing a television camera could be implemented utilizing a single television camera. For example, a single television camera may be mounted on a swivel allowing manual positioning to either the perpendicular optical axis position of a bombsight camera or the angled optical axis position of an auxiliary sighting system utilizing a television camera. Also for example, a single television camera with a sufficient field of view could be mounted at an optical axis angle in between the optical axis of the normal perpendicular mounting of a bombsight camera and the normal angled mounting of an auxiliary sighting system utilizing a television camera. In this case, the view in one section of the image displayed on a monitor attached to the television camera would be similar to that provided by a separate bombsight camera and the image displayed in another section of the same monitor would be similar to that provided by a separate auxiliary sighting system using a bombsight camera. Separate cross hairs or grids could be provided for each section of the display. When one television camera is utilized to provide the function of two, as in both of these examples, the carrier on which the television camera is mounted would be repositioned as part of switching between the two functions.

Figure 5:
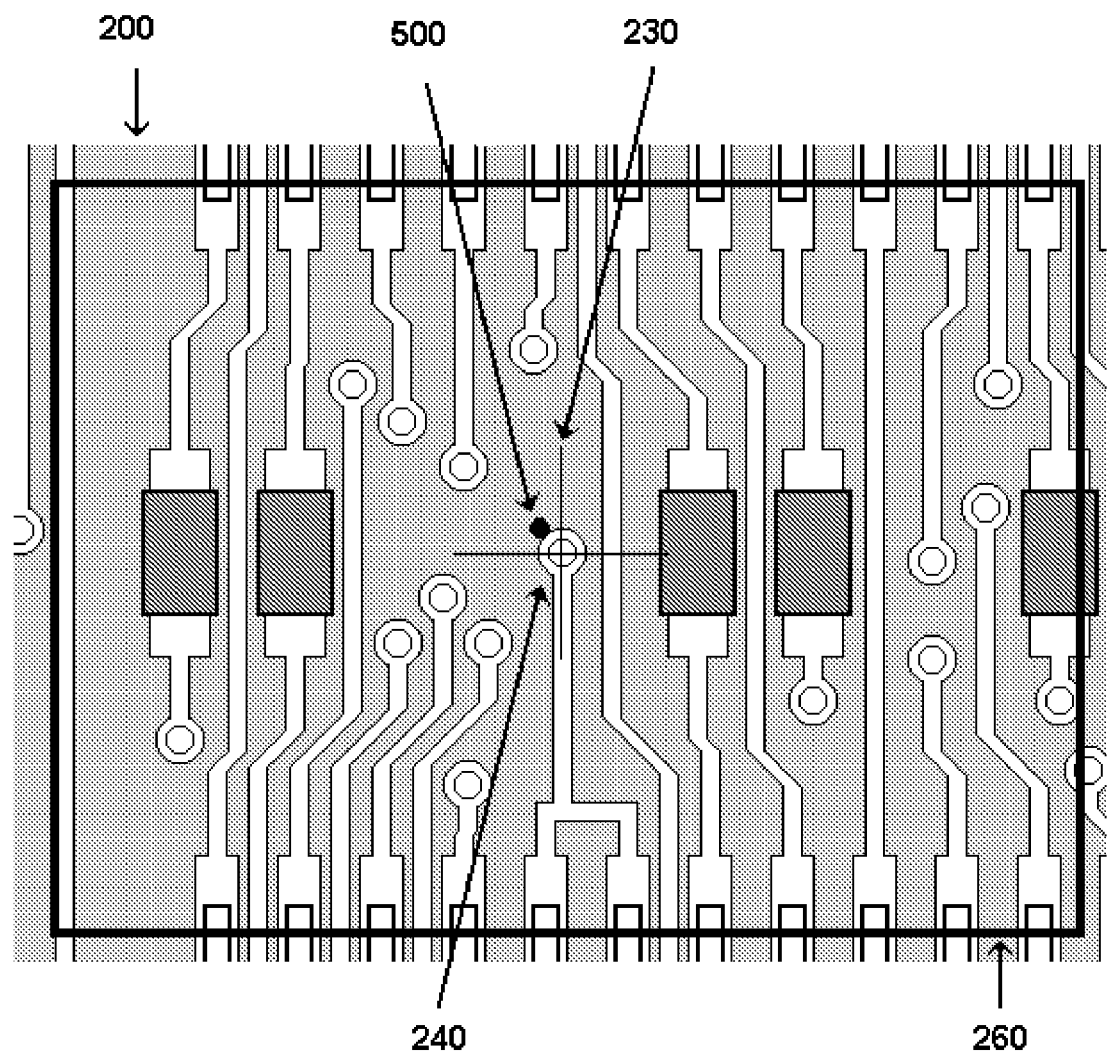
FIG. 5 shows the image provided by the bombsight camera of a typical flying prober system when the auxiliary sighting system of the present invention utilizes a focusable laser and the PCA to be tested has ideal planarity.

FIG. 5 illustrates the use of an auxiliary sighting system 131 wherein a source of light such as a precision optical device, laser or focusing laser is used in place of a television camera as in the previous description. The image shown is that provided by bombsight camera 120, such as previously shown in FIG. 2. A point of light is shown as spot 500. Were system 131 mounted in a precision manner, spot 500 might be made to shine on a point of PCA 140 in the center of cursor 230. However, since a small spot cannot be consistently and dependably reflected from the center of a via, it may be intentionally aimed off center. In some applications, the CAD data used to position carrier 100 could be modified such that the center of the cursor would appear off center on a properly positioned PCA 140.

Figure 6:
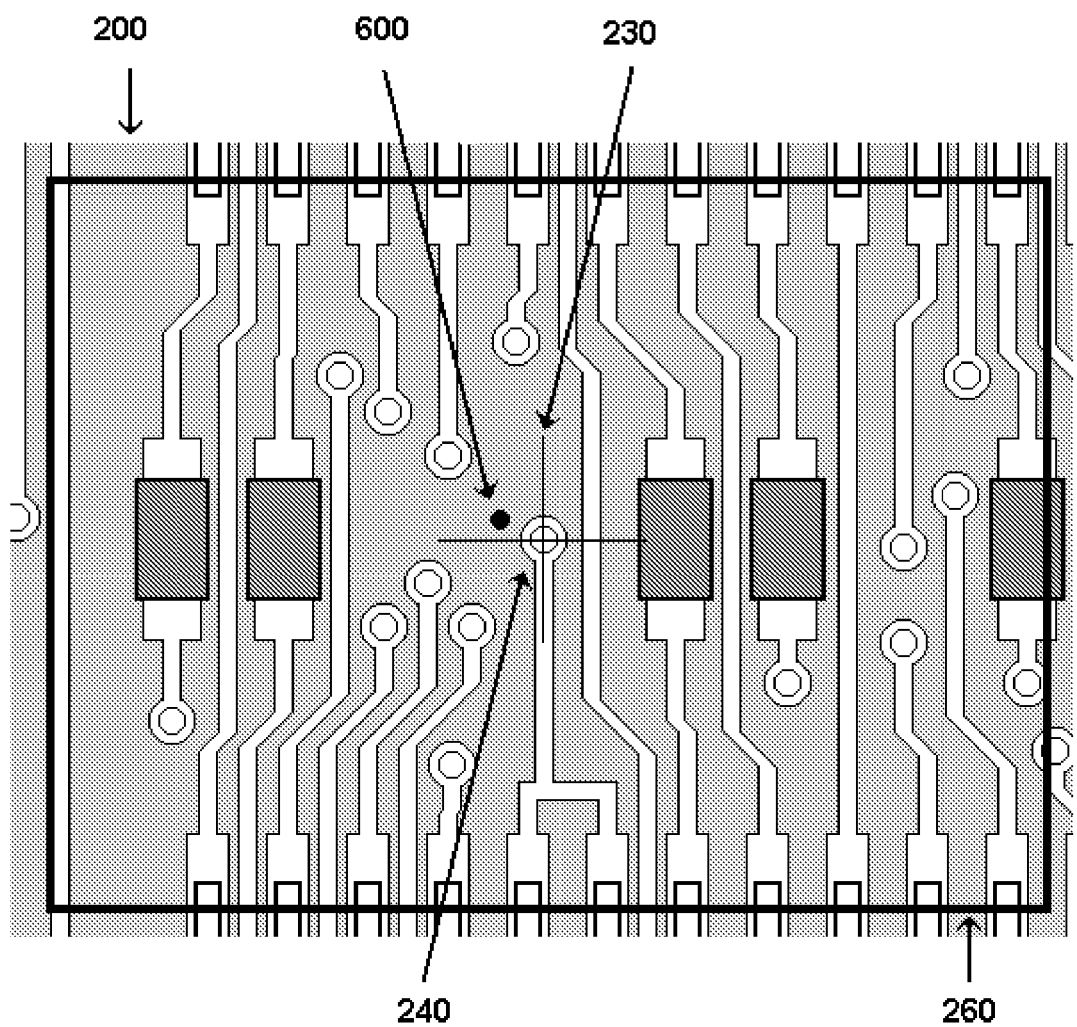
FIG. 6 shows the image provided by the bombsight camera of a typical flying prober system when the auxiliary sighting system of the present invention utilizes a focusable laser and the PCA to be tested has imperfect planarity.

FIG. 6 illustrates the effect of altering the Z-axis position of PCA 140. Spot 600 is in a slightly different position. The degree of offset is the same as would be observed were auxiliary sighting system 131 to utilize a television camera, as previously described, given the same conditions of the angle of the auxiliary sighting system 131 and Z-axis position change. The use of a pinpoint spot of light, however, affords an operator a potentially better view to determine whether a probe tip will touch within the via or other target. Further, it will be appreciated that when the angle of system 131 matches the greatest probing angle of any of the plurality of probes used in the flying prober system, such as probe 114, it can be more easily determined whether all probe tips will touch within the via or other target.

Figure 7:
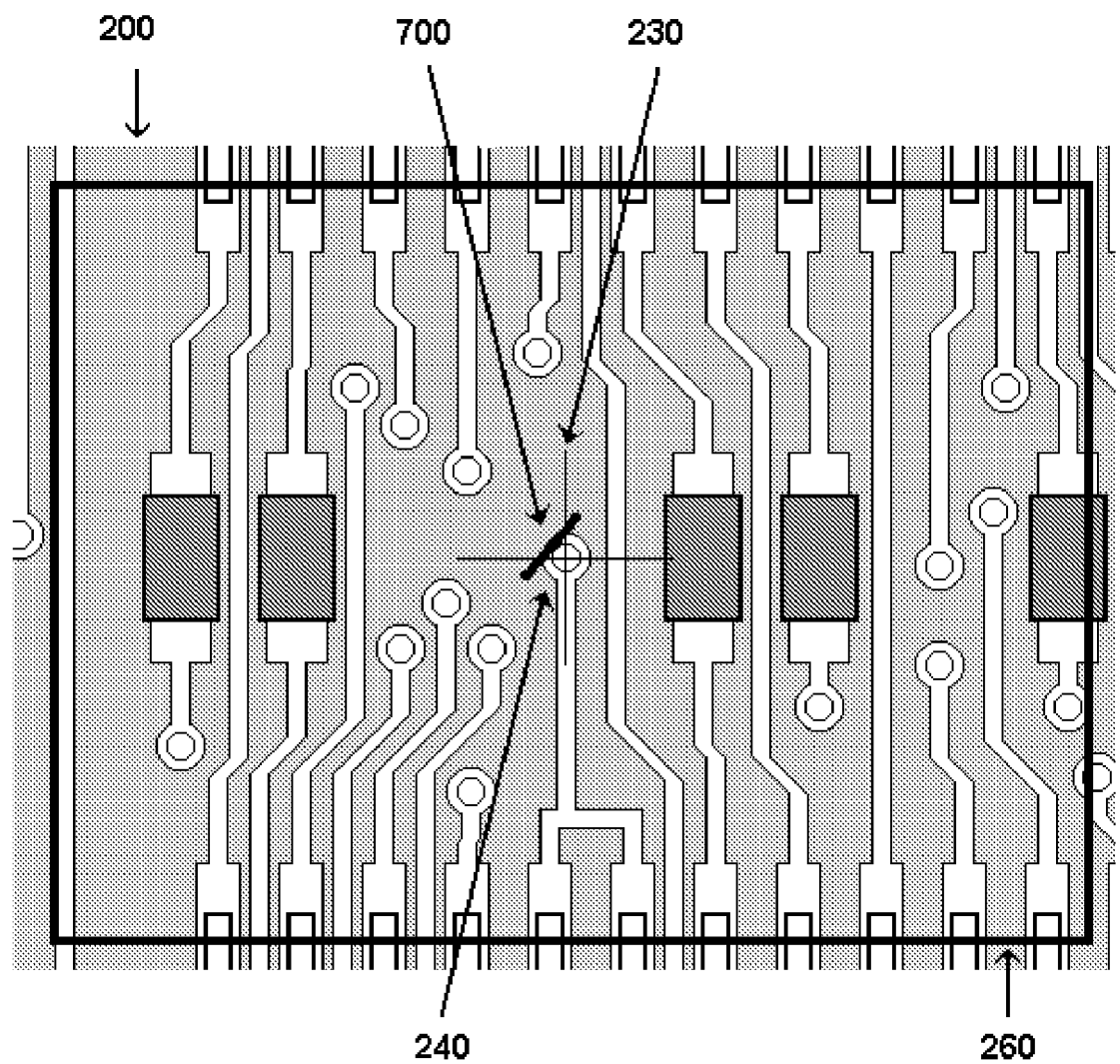
FIG. 7 shows the image provided by the bombsight camera of a typical flying prober system when the auxiliary sighting system of the present invention utilizes a focusable line laser and the PCA to be tested has ideal planarity.
Figure 8:
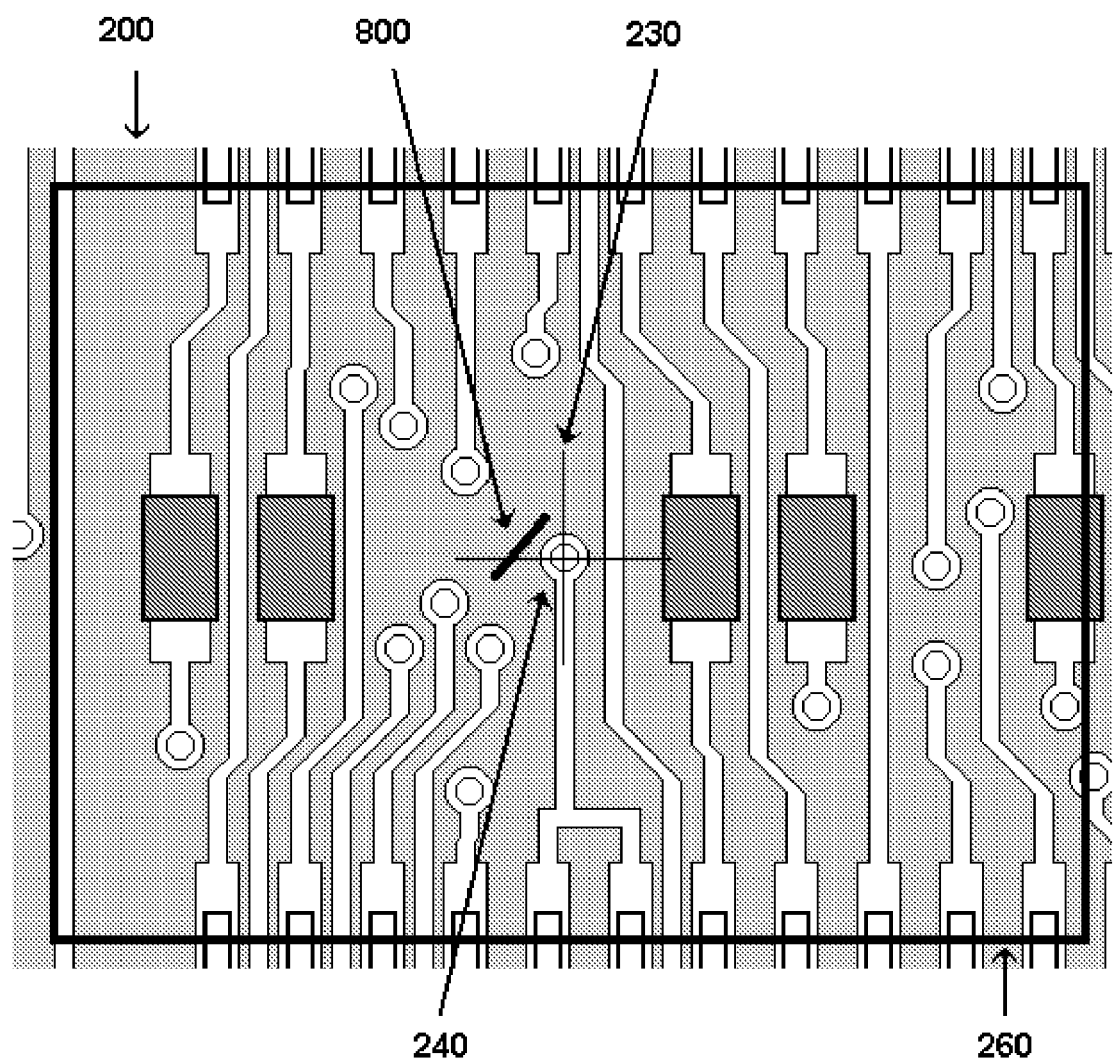
FIG. 8 shows the image provided by the bombsight camera of a typical flying prober system when the auxiliary sighting system of the present invention utilizes a focusable line laser and the PCA to be tested has imperfect planarity.

FIGS. 7 and 8 illustrate the use of a line laser in place of the spot laser used in auxiliary sighting system 131 described in connection with FIGS. 5 and 6. As shown, this type of laser projects a line on section 200 of PCA 140. The line length and width may vary, depending on the laser unit chosen. A line offers the advantage of being larger than most vias or other PCA test target points, which may be larger than a via. Thus, there is less need to shine the laser beam onto an area offset from the positions detailed in the CAD file for the PCA 140, making the CAD file usable without further processing. FIG. 7 illustrates an auxiliary sighting system 131 that is either not precisely mounted or calibrated or both, as discussed previously, where via 240 is at Z-axis zero position. That is, if auxiliary sighting system 131 were precisely mounted and calibrated, line 700 would be aligned with and appear to pass through the center of the cross hairs of the bombsight camera. The line laser of system 131 has projected line 700 onto the surface of PCA 140. In FIG. 8, all conditions are the same, except that the Z-axis position of PCA 140 has changed, thereby changing the position at which the line is projected onto the surface of PCA 140, shown as line 800.

Regarding FIGS. 5 through 8, it should be noted that the area in box 260, representing the view bombsight camera 120 provides of PCA 140 and in particular subsection 200, would change slightly, i.e., become wider or narrower, at different Z-axis positions. For ease of explanation, however, this difference has not been shown in the drawings nor included in the explanation. The change in area within box 260 from one view to the next has no significant effect upon operation of the present invention.

Use of light sources of the types described in implementing auxiliary sighting system 131 offers an opportunity to use image processing capabilities to obviate operator interaction with the test system similarly to the automation possibilities noted regarding feature recognition when auxiliary sighting system 131 utilizes a television camera.

Figure 9:
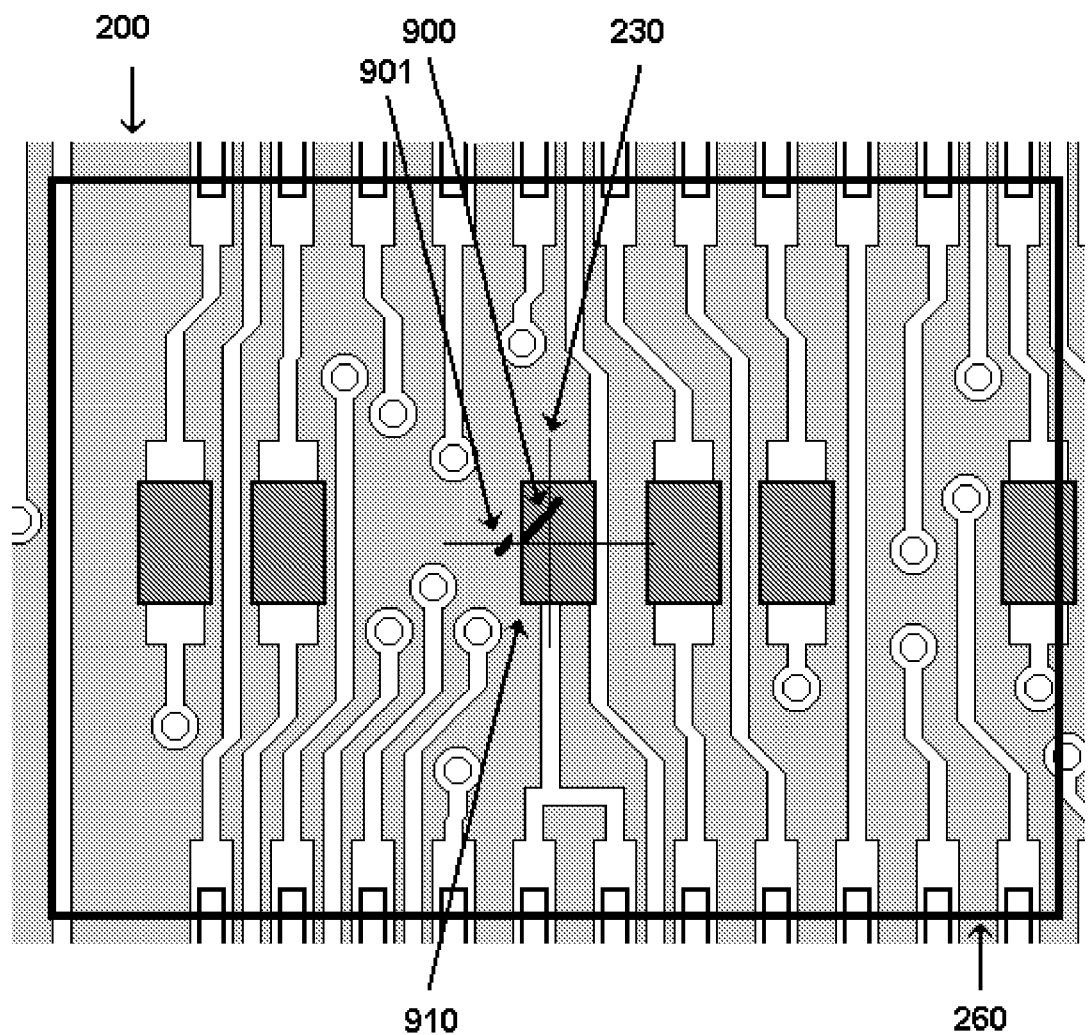
FIG. 9 shows the image provided by the bombsight camera of a typical flying prober system when the auxiliary sighting system of the present invention utilizes a focusable line laser and the PCA to be tested has an erroneously placed device.

FIG. 9 illustrates a view similar to FIG. 8, except that device 910 has erroneously been placed in the position shown. The line laser line is viewed through camera 120 as a broken line having sections 900 and 901, due to the Z-axis position difference of the PCA surface versus the top surface of device 910, drawing the operator's attention to a problem that might result in PCA and/or flying prober system damage. In an automated system that includes the auxiliary sighting system of the present invention, the similar use of a cross line laser to project a large "X" image would allow efficient inspection of a PCA for any erroneously placed parts.

DESCRIPTION OF OPERATION

With reference to FIGS. 1 through 4, operation of the preferred embodiment will now be described. The operation will be described relative to a specific example but the invention is not in any way limited to such use. In the preferred embodiment, the auxiliary sighting system 131 is assumed to be a television monitor camera as previously described relative to FIGS. 3 and 4.

It is assumed that the system has been previously calibrated such that a known point on the face of the monitor connected to the auxiliary sighting system camera 131 has been determined to correspond to a point which appears in the center of the cross hairs of the perpendicularly mounted bombsight camera 120 when the known point is at the Z-axis zero position. This calibration is achieved by mounting a PCA such that some distinguishable point is known to be at the Z-axis zero position, positioning camera 120 over it such that the distinguishable point appears centered in the cross hairs of the image on the operator's monitor associated with camera 120 and marking the position of that same distinguishable point on the face of the monitor associated with the angled camera 131 of the auxiliary sighting system. The marking may be made using a removable marking means, such as a felt tipped marking pen containing non-permanent ink. It is further assumed that a series of points have been predetermined that are more or less evenly spaced across the production PCA and are sufficiently close enough to each other that the Z-axis position of nearby points on the PCA may be safely inferred to be not significantly different than the Z-axis position of each chosen point.

The procedure for an operator to use according to the present invention is as follows using the list of points.

Step 1. Select a first point from the list.

Step 2. Move camera 120 to the X, Y of the selected point.

Step 3. Using the monitor associated with auxiliary sighting system camera 131, confirm that the point marked on the screen during the calibration process appears to be within a pre-established tolerance of the point selected and observed in step 2 which will safely assure good probe tip contact when test target points in the area neighboring the point are probed in subsequent testing of the PCA.

Step 4. Repeat steps 1 through 3 for each point of the list referenced in step 1. Make a list of all selected points where the point marked on the screen falls outside of the pre-established tolerance.

Step 5. Based on pre-established criteria, determine if the various points, if any, listed in step 4 preclude test of the PCA in its current mounting and alignment.

From the above description, it is seen how the method and apparatus of the present invention provides reliable testing of PCA's by the addition of an auxiliary sighting system. An advantage of the present invention is that the auxiliary sighting system and associated mounting devices can be constructed using standard components and devices. Further, such auxiliary sighting system can be easily installed within existing prober systems or incorporated into newly designed systems.

While in accordance with the provisions and statutes there has been illustrated and described the best form of the invention, certain changes may be made without departing from the spirit of the invention as set forth in the appended claims and, in some cases, certain features of the invention may be used to advantage without a corresponding use of other features. For example, the auxiliary sighting system may be battery operated and coupled to external equipment by radio or light signal means to obviate or minimize cabling requirements.

The invention claimed is:

1. A method of predicting prior to performing any testing the misprobing of test target points in flying prober testing of PCA's which contain a number of pre-established points or test target points defined by x and y coordinates, the system including at least one angled probe and, a camera system mounted to a support with an optical axis set perpendicularly to the ideal plane of the PCA for pretest determination of proper x and y coordinate positioning of test target points and other points during testing using a screen area containing a cross hair or similar positioning marking which is normally positioned in the center of the screen area for proper alignment of a test target point or other point on the PCA, the method including the addition of an auxiliary sighting system having an optical axis set at an angle to the ideal plane of the PCA and mounted to the same support as the perpendicularly mounted camera wherein the method comprises the following steps performed prior to any testing:

(a) selecting one of the previously established test target points or other points and positioning the perpendicularly set camera directly above the selected test target point or other point based on the x and y coordinate data for that test target point or point;

(b) establishing the point on the PCA indicated by the auxiliary sighting system to be directly in line with the optical axis of the auxiliary sighting system; and (c) determining the point at which said angled probe would contact the PCA in the area of the selected point based on point location data obtained during calibration to predict if the probe tip would suitably contact one or more test target points during the testing of the PCA.

2. The method of claim 1 wherein steps a through c are repeated for each of a selected number of pre-established points for enabling accurate test target point contact prediction in testing of an entire PCA, wherein the selected points correspond to test target points to be used in testing of the PCA or wherein the selected points correspond to other features of the PCA where contact is not required and contact prediction is inferred relative to neighboring areas of the PCA where contact is required.

3. The method of claim 1 wherein the one or more steps are manually performed or wherein one or more steps are incorporated into the programming of the flying prober system.

4. The method of claim 2 wherein the selected number of pre-established points is a function of PCA size, wherein the selected number of pre-established points is a function of the size of the test target points, wherein the end result is a determination whether or not to test a given PCA, wherein the end result is a determination of what corrective action may be taken to allow testing of a PCA that would otherwise be determined as unsuitable for testing or wherein the end result is the generation of a list of z coordinates of the test target points for use on a flying prober system capable of utilizing such a list to compensate for PCA non-planarity.

5. The method of claim 2 wherein the detection of erroneously mounted components on the PCA is performed in conjunction with contact prediction.

6. Apparatus for predicting misprobing of test target points in testing of PCA's which contain a number of pre-established points defined by x and y coordinates, the flying prober system including at least one probe, a camera system mounted with a support with an optical axis set perpendicularly to the ideal plane of the PCA for pretest determination of proper x and y coordinate positioning of test target points and other points during testing using a screen area containing a cross hair or similar positioning marking which is normally positioned in the center of the screen area for proper alignment of a point on the PCA and means for selecting one of the previously established points and positioning the cross hair or similar positional marking system, the apparatus comprising:

(a) an auxiliary sighting system having an optical axis set at an angle to the perpendicularly mounted camera;

(b) mounting apparatus for mounting the auxiliary sighting system to the same support as the perpendicularly mounted camera; and (c) apparatus for determining the point on the PCA which is in direct line with the optical axis of the auxiliary sighting system.

7. The apparatus of claim 6 wherein the auxiliary sighting system and apparatus for determining comprise a television camera and monitor.

8. The apparatus of claim 6 wherein the auxiliary sighting system comprises a precision light source and the apparatus for determining comprises the standard perpendicular camera and monitor.

9. The apparatus of claim 8 wherein the precision light source is an optical device comprising one or more lenses and a number of lamps for projecting a predetermined light pattern of either a pinpoint spot or one or more thin lines onto the surface of the PCA.

10. The apparatus of claim 8 wherein the precision light source is a laser.

11. The apparatus of claim 10 wherein the laser is fixed or focusable and wherein the laser projects a pinpoint spot or a thin line or crossed lines onto the surface of the PCA.

12. The apparatus of claim 8 wherein the precision light source may be switched on and off manually, randomly or under program control for making the light source projected pattern more recognizable.

13. The apparatus of claim 6 wherein the apparatus for determining utilizes manually viewed images displayed on either or both monitors or wherein the apparatus for determining comprises an automatic means of processing video information, contained in images displayed on either or both monitors.

14. The apparatus of claim 6 wherein a television camera is repositionable such that it may serve as either the perpendicular bombsight camera or the angled sighting camera, wherein the television camera angle may be repositioned or wherein different sections of the field of view of the camera are utilized such that it may serve as either the perpendicular bombsight camera or the angled sighting camera without angular repositioning.

15. The apparatus of claim 6 wherein the angle of the optical axis of the auxiliary sighting system is the same as the angle of one or more probes of the flying prober system with respect to the optical axis of the perpendicularly mounted camera.

16. The apparatus of claim 6 wherein the auxiliary sighting system is not attached to the same support mechanism as the perpendicularly mounted camera.

17. The apparatus of claim 6 wherein the auxiliary sighting system comprises either means for adjusting the optical axis of the auxiliary sighting system for calibration purposes or mounting apparatus for enabling the system to be readily removed or installed.

18. The apparatus of claim 6 further comprising a calibration PCA including a marked point corresponding to Z-axis zero or a plurality of known Z-axis levels which may include Z axis zero when the calibration PCA is properly mounted in the flying prober system.

19. The apparatus of claim 6 wherein the auxiliary sighting system and a camera equivalent to the bombsight camera together are provided as an integral unit facilitating addition to an existing flying prober system.

20. A method of predicting prior to performing any testing the misprobing of test target points in flying prober testing of PCA's which contain a number of pre-established points defined by x and y coordinates, the system including at least one angled probe and, a camera system mounted to a support with an optical axis set perpendicularly to the ideal plane of the PCA for pretest determination of proper x and y coordinate positioning of test target points and other points during testing using a screen area containing a cross hair or similar positioning marking which is normally positioned in the center of the screen area for proper alignment of a point on the PCA, the method comprising the following steps performed prior to any testing:

(a) selecting one of the previously established test target points or other points and positioning the perpendicularly set camera directly above the selected test target point or other point based on the x and y coordinate data for that test target point or other point;

(b) establishing the point on the PCA indicated by an auxiliary sighting system to be directly in line with the optical axis of the auxiliary sighting system, the optical axis being set at an angle to the optical axis of the perpendicularly mounted camera; and (c) determining the point at which said angled probe would contact the PCA in the area of the selected point based on point location data obtained during calibration to predict if the probe tip would suitably contact one or more test target points during the testing of the PCA.

* * * * *